(12) United States Patent
Benvegnu et al.

(10) Patent No.: US 7,998,358 B2
(45) Date of Patent: Aug. 16, 2011

(54) PEAK-BASED ENDPOINTING FOR CHEMICAL MECHANICAL POLISHING

(75) Inventors: Dominic J. Benvegnu, La Honda, CA (US); Bogdan Swedek, Cupertino, CA (US); David J. Lischka, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1205 days.

(21) Appl. No.: 11/555,171

(22) Filed: Oct. 31, 2006

(65) Prior Publication Data

US 2008/0099443 A1  May 1, 2008

(51) Int. Cl.
*C03C 15/00* (2006.01)

(52) U.S. Cl. .............. 216/84; 216/85; 216/89; 438/692; 438/693; 700/121

(58) Field of Classification Search .................... 216/84, 216/85, 89; 438/692, 693; 700/121
See application file for complete search history.

(56) References Cited

U.S. PATENT DOCUMENTS

| | | | |
|---|---|---|---|
| 5,365,340 A | 11/1994 | Ledger | |
| 5,747,380 A | 5/1998 | Yu et al. | |
| 5,893,796 A | 4/1999 | Birang et al. | |
| 6,153,116 A | 11/2000 | Yang et al. | |
| 6,172,756 B1 | 1/2001 | Chalmers et al. | |
| 6,184,985 B1 | 2/2001 | Chalmers et al. | |
| 6,190,234 B1 | 2/2001 | Swedek et al. | |
| 6,204,922 B1 | 3/2001 | Chalmers | |
| 6,271,047 B1 | 8/2001 | Ushio et al. | |
| 6,296,548 B1 | 10/2001 | Wiswesser et al. | |
| 6,358,327 B1 | 3/2002 | Pokhama et al. | |
| 6,361,646 B1 | 3/2002 | Bibby, Jr. et al. | |
| 6,489,624 B1 | 12/2002 | Ushio et al. | |
| 6,511,363 B2 | 1/2003 | Yamane et al. | |
| 6,618,130 B2 * | 9/2003 | Chen ............................... 356/73 |
| 6,623,991 B2 | 9/2003 | Johnson et al. | |
| 6,664,557 B1 | 12/2003 | Amartur | |
| 6,670,200 B2 | 12/2003 | Ushio et al. | |
| 6,676,482 B2 | 1/2004 | Bibby, Jr. et al. | |
| 6,678,046 B2 | 1/2004 | Opsal | |
| 6,678,055 B2 | 1/2004 | Du-Nour et al. | |
| 6,762,838 B2 | 7/2004 | Du-Nour | |

(Continued)

FOREIGN PATENT DOCUMENTS

EP  1176631  1/2002

(Continued)

OTHER PUBLICATIONS

Applied Materials, Inc., International Search Report and the Written Opinion of the International Application No. PCT/US2007/083045 dated Apr. 18, 2008, 9 pages.

*Primary Examiner* — Binh X Tran
(74) *Attorney, Agent, or Firm* — Fish & Richardson P.C.

(57) ABSTRACT

A polishing system receives one or more target parameters for a selected peak in a spectrum of light, polishes a substrate, measures a current spectrum of light reflected from the substrate while the substrate is being polished, identifies the selected peak in the current spectrum, measures one or more current parameters of the selected peak in the current spectrum, compares the current parameters of the selected peak to the target parameters, and ceases to polish the substrate when the current parameters and the target parameters have a predefined relationship.

18 Claims, 10 Drawing Sheets

U.S. PATENT DOCUMENTS

| | | |
|---|---|---|
| 6,768,967 B2 | 7/2004 | Johnson et al. |
| 6,801,321 B1 | 10/2004 | Du-Nour |
| 6,806,105 B2 | 10/2004 | Johnson et al. |
| 6,806,948 B2 | 10/2004 | Katz et al. |
| 6,813,034 B2 | 11/2004 | Rosencwaig et al. |
| 6,819,426 B2 | 11/2004 | Sezginer et al. |
| 6,836,328 B2 | 12/2004 | Opsal |
| 6,842,259 B2 | 1/2005 | Rosencwaig et al. |
| 6,885,467 B2 | 4/2005 | DuNour et al. |
| 6,898,596 B2 | 5/2005 | Aikens et al. |
| 6,908,374 B2 | 6/2005 | Wang et al. |
| 6,947,135 B2 | 9/2005 | Johnson |
| 6,995,842 B2 | 2/2006 | Opsal |
| 7,018,271 B2 | 3/2006 | Ushio et al. |
| 7,097,537 B1 | 8/2006 | David et al. |
| 7,255,771 B2 | 8/2007 | Chen et al. |
| 7,409,260 B2 | 8/2008 | David et al. |
| 2002/0030826 A1 | 3/2002 | Chalmers et al. |
| 2002/0127951 A1 | 9/2002 | Ishikawa et al. |
| 2002/0155789 A1 | 10/2002 | Bibby, Jr. et al. |
| 2002/0173225 A1 | 11/2002 | Wang et al. |
| 2003/0002032 A1 | 1/2003 | DuNour |
| 2003/0022400 A1 | 1/2003 | Nomoto et al. |
| 2003/0098704 A1 | 5/2003 | DuNour et al. |
| 2003/0153246 A1 | 8/2003 | Desai et al. |
| 2003/0184732 A1 | 10/2003 | Katz et al. |
| 2003/0205664 A1 | 11/2003 | Abe et al. |
| 2004/0080761 A1 | 4/2004 | Du-Nour et al. |
| 2005/0026542 A1* | 2/2005 | Battal et al. ............... 451/5 |
| 2005/0117164 A1 | 6/2005 | Nomoto et al. |
| 2006/0020419 A1 | 1/2006 | Benvegnu |
| 2006/0274326 A1 | 12/2006 | Kobayashi et al. |
| 2007/0039925 A1 | 2/2007 | Swedek et al. |
| 2007/0042675 A1 | 2/2007 | Benvegnu et al. |

FOREIGN PATENT DOCUMENTS

| | | |
|---|---|---|
| JP | 2000-183001 | 6/2000 |
| JP | 2000-310512 | 11/2000 |
| JP | 2001-287159 | 10/2001 |
| JP | 2002-359217 | 12/2002 |
| JP | 2005-159203 | 6/2005 |
| WO | WO 00/54935 | 9/2000 |
| WO | WO 01/72470 | 10/2001 |
| WO | WO 2004/035265 | 4/2004 |

* cited by examiner

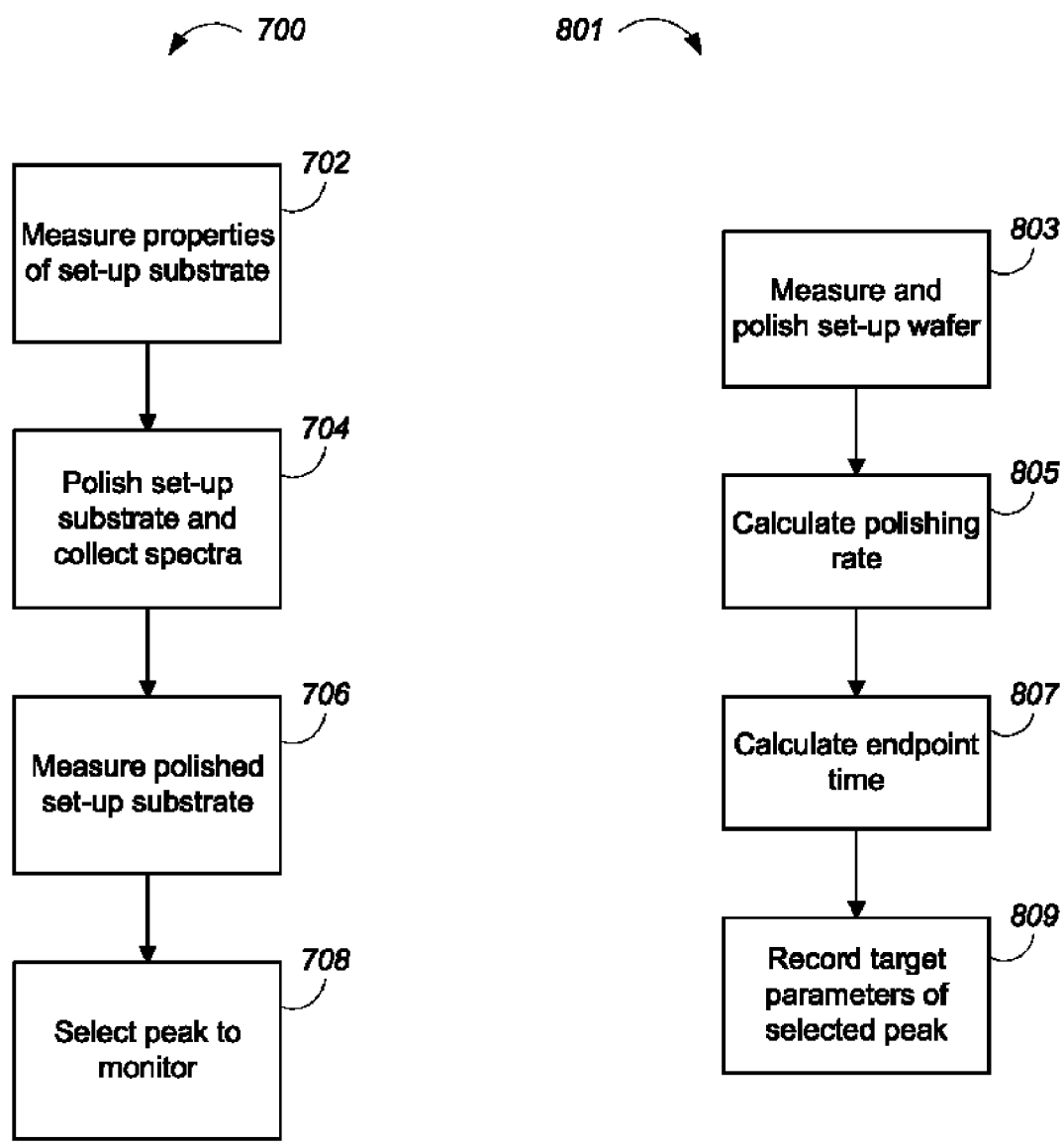

PEAK-BASED ENDPOINTING FOR CHEMICAL MECHANICAL POLISHING

BACKGROUND

The present invention relates to generally to chemical mechanical polishing of substrates.

An integrated circuit is typically formed on a substrate by the sequential deposition of conductive, semiconductive, or insulative layers on a silicon wafer. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non planar surface. In addition, planarization of the substrate surface is usually required for photolithography.

Chemical mechanical polishing (CMP) is one accepted method of planarization. This planarization method typically requires that the substrate be mounted on a carrier or polishing head. The exposed surface of the substrate is typically placed against a rotating polishing disk pad or belt pad. The polishing pad can be either a standard pad or a fixed abrasive pad. A standard pad has a durable roughened surface, whereas a fixed-abrasive pad has abrasive particles held in a containment media. The carrier head provides a controllable load on the substrate to push it against the polishing pad. A polishing slurry is typically supplied to the surface of the polishing pad. The polishing slurry includes at least one chemically reactive agent and, if used with a standard polishing pad, abrasive particles.

One problem in CMP is determining whether the polishing process is complete, i.e., whether a substrate layer has been planarized to a desired flatness or thickness, or when a desired amount of material has been removed. Overpolishing (removing too much) of a conductive layer or film leads to increased circuit resistance. On the other hand, underpolishing (removing too little) of a conductive layer leads to electrical shorting. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, the polishing endpoint cannot be determined merely as a function of polishing time.

SUMMARY

In one aspect, the invention is directed to a method performed by a polishing system. The method includes receiving one or more target parameters for a selected peak in a spectrum of light, polishing a substrate, measuring a current spectrum of light reflected from the substrate while the substrate is being polished, identifying the selected peak in the current spectrum, measuring one or more current parameters of the selected peak in the current spectrum, comparing the current parameters of the selected peak to the target parameters, and ceasing to polish the substrate when the current parameters and the target parameters have a pre defined relationship.

In one aspect, the invention is directed to a computer program product, tangibly embodied on a computer readable medium. The computer program product comprises instructions to cause a polishing system to perform the method above.

Implementations of the inventions may include one or more of the following. The current spectrum can be enhanced. Additional spectra of light reflected from the substrate can be measured during polishing, and at least one of the additional spectra can be combined with the current spectrum. The target parameters and the current parameters can include at least one of a wavelength of the selected peak, a width of the selected peak, a change in a wavelength of the selected peak or a change in a width of the selected peak. The change can be measured relative to when a parameter of the selected peak reaches a pre defined value. A set-up substrate can be polished, calibration spectra of light reflected from the set up substrate can be measured while the set up substrate is being polished, an endpoint time at which a film on the set up substrate has reached a desired thickness can be estimated, and the target parameters can be determined from the calibration spectra using the estimated endpoint time.

In another aspect, the invention is directed to a polishing endpoint detection system. The endpoint detection system includes a light source to direct light to a substrate while a substrate is being polished, a spectrometer to measure a current spectrum of light reflected from the substrate while the substrate is being polished, and a controller. The controller is configured to store one or more target parameters for a selected peak in a spectrum of light, receive a measurement of the current spectrum from the spectrometer, identify the selected peak in the current spectrum, measure one or more current parameters of the selected peak in the current spectrum, compare the current parameters of the selected peak to the target parameters, and generate a signal to halt polishing of the substrate when the current parameters and the target parameters have a pre defined relationship.

In another aspect, the invention is directed to a polishing system. The polishing system includes a support to hold a polishing pad, a carrier head to hold the substrate, a motor to generate relative motion between the substrate and the polishing pad, and the polishing endpoint detection system above.

Implementations of the inventions may include one or more of the following. The target parameters and the current parameters can include at least one of a wavelength of the selected peak or a width of the selected peak. The light source can be a white light source. The light source and the spectrometer can be located on a side of the substrate opposite the carrier head.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

Possible advantages of implementations of the invention can include one or more of the following. Endpoint determination can be made virtually without consideration of variations in polishing rate. Factors that affect polishing rate, for example, consumables, generally need not be considered. A best wavelength or wavelengths of light can be chosen to use for endpoint detection for a particular product.

The details of one or more embodiments of the invention are set forth in the accompanying drawings and the descrip-

BRIEF DESCRIPTION OF THE DRAWINGS

FIG. 7 shows a method for selecting a peak to monitor.

FIG. 8 shows a method for obtaining target parameters for the selected peak.

Like reference numbers and designations in the various drawings indicate like elements.

DETAILED DESCRIPTION

Figure 1:
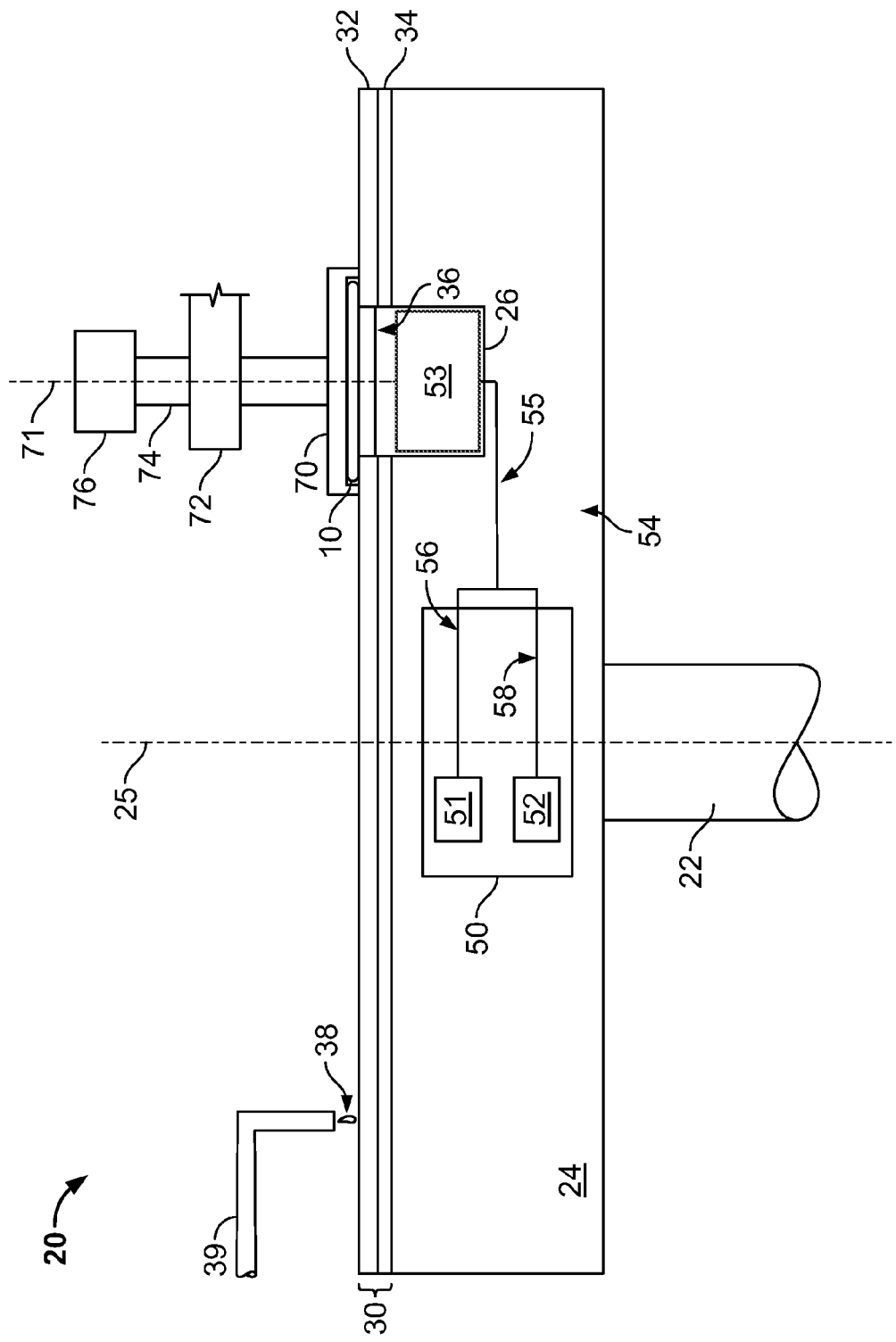
FIG. 1 shows a chemical mechanical polishing apparatus.

FIG. 1 shows a polishing apparatus 20 operable to polish a substrate 10. The polishing apparatus 20 includes a rotatable disk-shaped platen 24, on which a polishing pad 30 is situated. The platen is operable to rotate about axis 25. For example, a motor can turn a drive shaft 22 to rotate the platen 24. The polishing pad 30 can be detachably secured to the platen 24, for example, by a layer of adhesive. When worn, the polishing pad 30 can be detached and replaced. The polishing pad 30 can be a two-layer polishing pad with an outer polishing layer 32 and a softer backing layer 34.

Optical access 36 through the polishing pad is provided by including an aperture (i.e., a hole that runs through the pad) or a solid window. The solid window can be secured to the polishing pad, although in some implementations the solid window can be supported on the platen 24 and project into an aperture in the polishing pad. The polishing pad 30 is usually placed on the platen 24 so that the aperture or window overlies an optical head 53 situated in a recess 26 of the platen 24. The optical head 53 consequently has optical access through the aperture or window to a substrate being polished. The optical head is further described below.

The window can be, for example, a rigid crystalline or glassy material, e.g., quartz or glass, or a softer plastic material, e.g., silicone, polyurethane or a halogenated polymer (e.g., a fluoropolymer), or a combination of the materials mentioned. The window can be transparent to white light. If a top surface of the solid window is a rigid crystalline or glassy material, then the top surface should be sufficiently recessed from the polishing surface to prevent scratching. If the top surface is near and may come into contact with the polishing surface, then the top surface of the window should be a softer plastic material. In some implementations the solid window is secured in the polishing pad and is a polyurethane window, or a window having a combination of quartz and polyurethane. The window can have high transmittance, for example, approximately 80% transmittance, for monochromatic light of a particular color, for example, blue light or red light. The window can be sealed to the polishing pad 30 so that liquid does not leak through an interface of the window and the polishing pad 30.

In one implementation, the window includes a rigid crystalline or glassy material covered with an outer layer of a softer plastic material. The top surface of the softer material can be coplanar with the polishing surface. The bottom surface of the rigid material can be coplanar with or recessed relative to the bottom surface of the polishing pad. In particular, if the polishing pad includes two layers, the solid window can be integrated into the polishing layer, and the bottom layer can have an aperture aligned with the solid window.

Assuming that the window includes a combination of a rigid crystalline or glassy material and a softer plastic material, no adhesive need be used to secure the two portions. For example, in one implementation, no adhesive is used to couple the polyurethane portion to the quartz portion of the window. Alternatively, an adhesive that is transparent to white light can be used or an adhesive can be applied so that light passing through the window does not pass through the adhesive. By way of example, the adhesive can be applied only to the perimeter of the interface between the polyurethane and quartz portion. A refractive index gel can be applied to a bottom surface of the window.

A bottom surface of the window can optionally include one or more recesses. A recess can be shaped to accommodate, for example, an end of an optical fiber cable or an end of an eddy current sensor. The recess allows the end of the optical fiber cable or the end of the eddy current sensor to be situated at a distance, from a substrate surface being polished, that is less than a thickness of the window. With an implementation in which the window includes a rigid crystalline portion or glass like portion and the recess is formed in such a portion by machining, the recess is polished so as to remove scratches caused by the machining. Alternatively, a solvent and/or a liquid polymer can be applied to the surfaces of the recess to remove scratches caused by machining. The removal of scratches usually caused by machining reduces scattering and can improve the transmittance of light through the window.

Figure 2A:
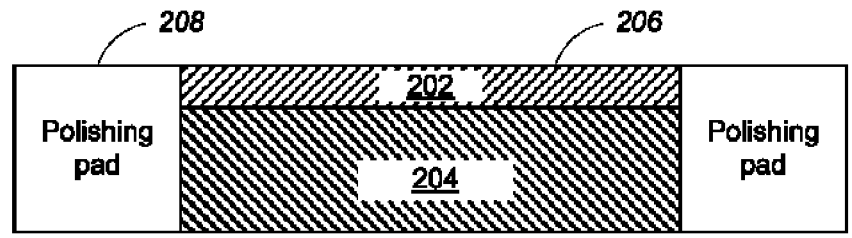
FIGS. 2A-2H show implementations of a polishing pad window.

FIGS. 2A-2H show various implementations of the window. As shown in FIG. 2A, the window can have two portions, a polyurethane portion 202 and a quartz portion 204. The portions are layers, with the polyurethane portion 202 situated on top of the quartz portion 204. The window can be situated in the polishing pad so that the top surface 206 of the polyurethane layer is coplanar with a polishing surface 208 of the polishing pad.

Figure 2B:
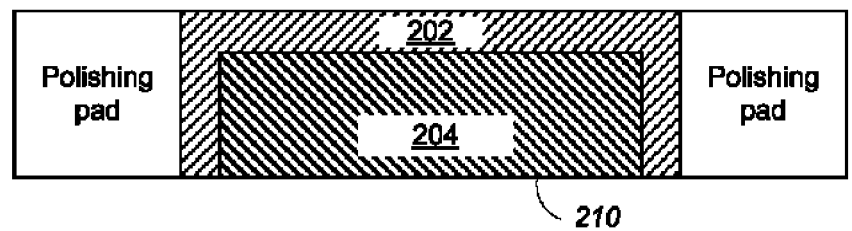

As shown in FIG. 2B, the polyurethane portion 202 can have a recess in which the quartz portion is situated. A bottom surface 210 of the quartz portion is exposed.

Figure 2C:
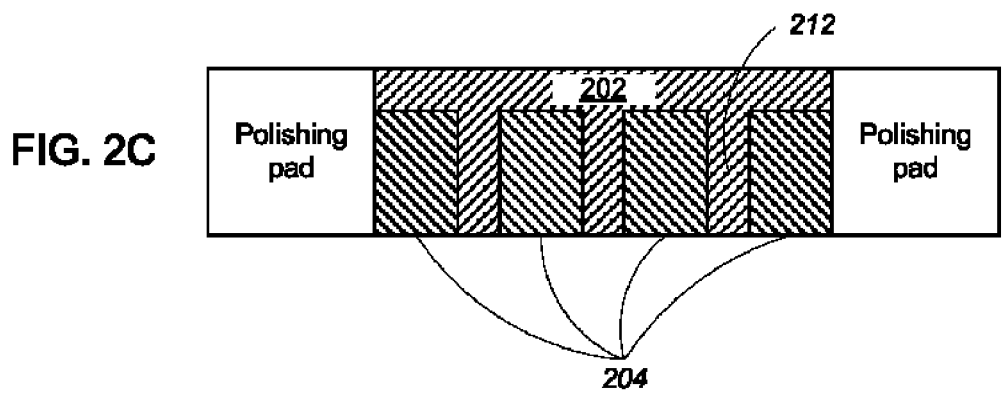

As shown in FIG. 2C, the polyurethane portion 202 can include projections, for example, projection 212, that project into the quartz portion 204. The projections can act to reduce the likelihood that the polyurethane portion 202 will be pulled away from the quartz portion 204 due to friction from the substrate or retaining ring.

Figure 2D:
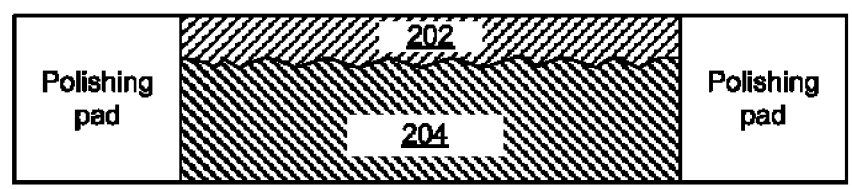

As shown in FIG. 2D, the interface between the polyurethane portion 202 and quartz portion 204 can be a rough surface. Such a surface can improve the strength of the coupling of the two portions of the window, also reducing the likelihood the polyurethane portion 202 will be pulled away from the quartz portion 204 due to friction from the substrate or retaining ring.

Figure 2E:
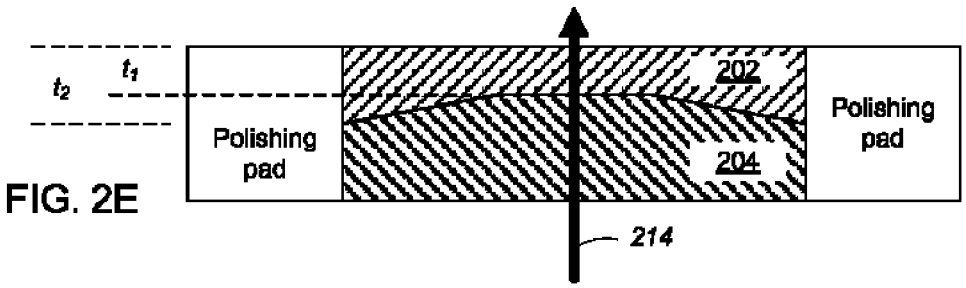

As shown in FIG. 2E, the polyurethane portion 202 can have non-uniform thickness. The thickness at a location that would be in the path 214 of a light beam is less than the thickness at a location that would not be in the path 214 of the light beam. By way of example, thickness $t_1$ is less than thickness $t_2$. Alternatively, the thickness can be less at the edges of the window.

Figure 2F:
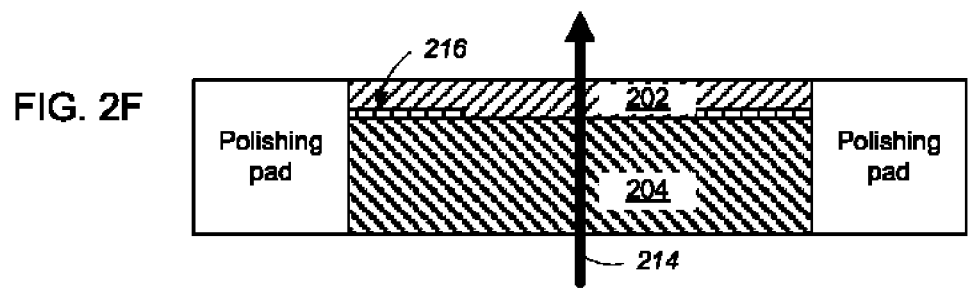

As shown in FIG. 2F, the polyurethane portion 202 can be attached to the quartz portion 204 by use of an adhesive 216. The adhesive can be applied so that it would not be in the path 214 of the light beam.

Figure 2G:
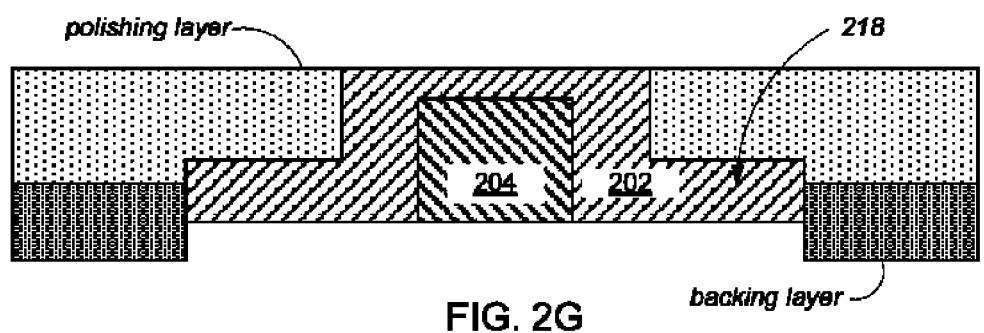

As shown in FIG. 2G, the polishing pad can include a polishing layer and a backing layer. The polyurethane portion 202 extends through the polishing layer and at least partially into the backing layer. The hole in the backing layer can be larger in size than the hole in the polishing layer, and the section of the polyurethane in the backing layer can be wider than the section of the polyurethane in the polishing layer. The polishing layer thus provides a lip 218 which overhangs the window and which can act to resist a pulling of the polyurethane portion 202 away from the quartz portion 204. The polyurethane portion 202 conforms to the holes of the layers of the polishing pad.

Figure 2H:
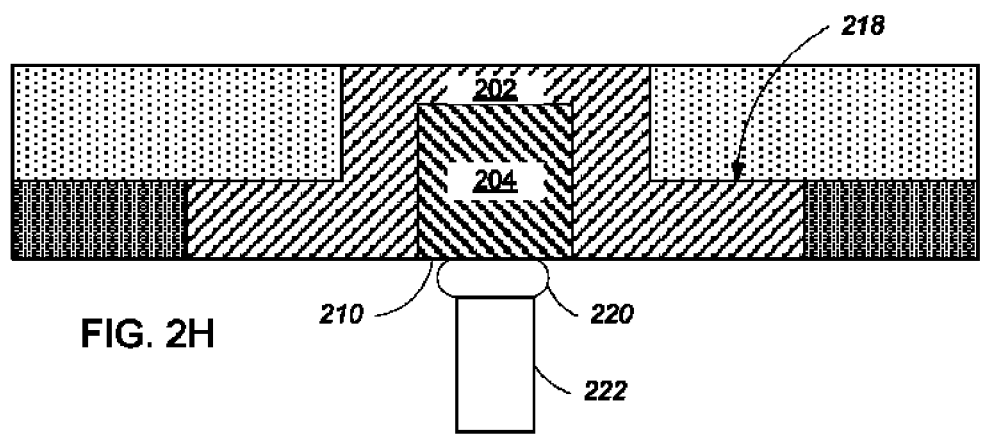

As shown in FIG. 2H, refractive index gel 220 can be applied to the bottom surface 210 of the quartz portion 204 so as to provide a medium for light to travel from a fiber cable 222 to the window. The refractive index gel 220 can fill the volume between the fiber cable 222 and the quartz portion 204 and can have a refractive index that matches or is between the indices of refraction of the fiber cable 222 and the quartz portion 204.

In implementations where the window includes both quartz and polyurethane portions, the polyurethane portion should have a thickness so that, during the life time of the polishing pad, the polyurethane portion will not be worn so as to expose the quartz portion. The quartz can be recessed from the bottom surface of the polishing pad, and the fiber cable 222 can extend partially into the polishing pad.

The above described window and polishing pad can be manufactured using a variety of techniques. The polishing pad's backing layer 34 can be attached to its outer polishing layer 32, for example, by adhesive. The aperture that provides optical access 36 can be formed in the pad 30, e.g., by cutting or by molding the pad 30 to include the aperture, and the window can be inserted into the aperture and secured to the pad 30, e.g., by an adhesive. Alternatively, a liquid precursor of the window can be dispensed into the aperture in the pad 30 and cured to form the window. Alternatively, a solid transparent element, e.g., the above described crystalline or glass like portion, can be positioned in liquid pad material, and the liquid pad material can be cured to form the pad 30 around the transparent element. In either of the later two cases, a block of pad material can be formed, and a layer of polishing pad with the molded window can be scythed from the block.

With an implementation in which the window includes a crystalline or glass-like first portion and a second portion made of soft plastic material, the second portion can be formed in the aperture of the pad 30 by applying the described liquid precursor technique. The first portion can then be inserted. If the first portion is inserted before the liquid precursor of the second portion is cured, then curing can bond the first and second portions. If the first portion is inserted after the liquid precursor is cured, then the first and second potions can be secured by using an adhesive.

The polishing apparatus 20 can include a flushing system to improve light transmission through the optical access 36. There are different implementations of the flushing system. With implementations of the polishing apparatus 20 in which the polishing pad 30 includes an aperture instead of a solid window, the flushing system is implemented to provide a laminar flow of a fluid, e.g., a gas or liquid, across a top surface of the optical head 53. (The top surface can be a top surface of a lens included in the optical head 53.) The laminar flow of fluid across the top surface of the optical head 53 can sweep opaque slurry out of the optical access and/or prevent slurry from drying on the top surface and, consequently, improves transmission through the optical access. With implementations in which the polishing pad 30 includes a solid window instead of an aperture, the flushing system is implemented to direct a flow of gas at a bottom surface of the window. The flow of gas can prevent condensation from forming at the solid window's bottom surface which would otherwise impede optical access.

Figure 3:
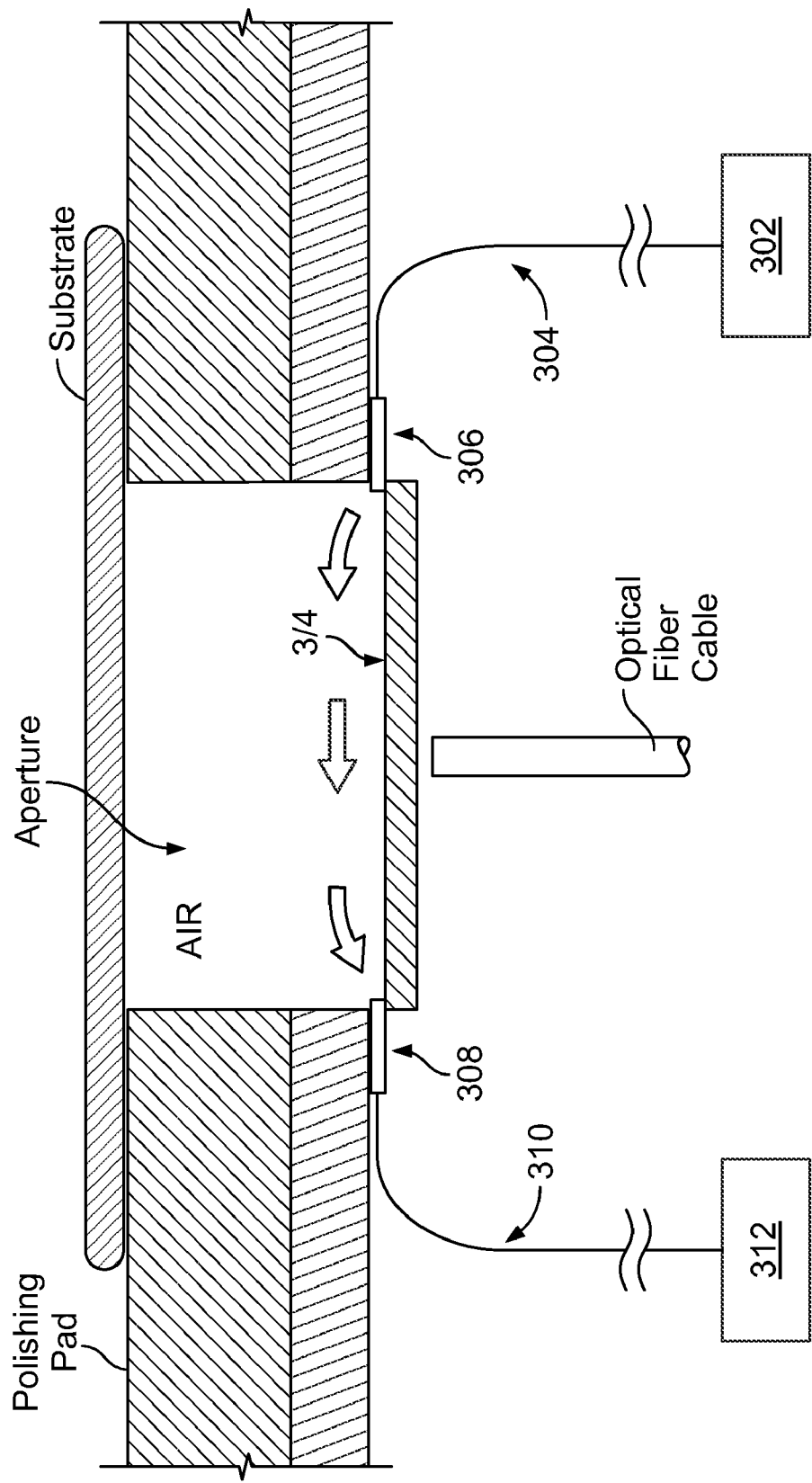
FIG. 3 shows an implementation of a flushing system.

FIG. 3 shows an implementation of the laminar-flow flushing system. The flushing system includes a gas source 302, a delivery line 304, a delivery nozzle 306, a suction nozzle 308, a vacuum line 310, and a vacuum source 312. The gas source 302 and vacuum source can be configured so that they can introduce and suction a same or a similar volume of gas. The delivery nozzle 306 is situated so that the laminar flow of gas is directed across the transparent top surface 314 of the in-situ monitoring module and not directed at the substrate surface being polished. Consequently, the laminar flow of gas does not dry out slurry on a substrate surface being polished, which can undesirably affect polishing.

Figure 4:
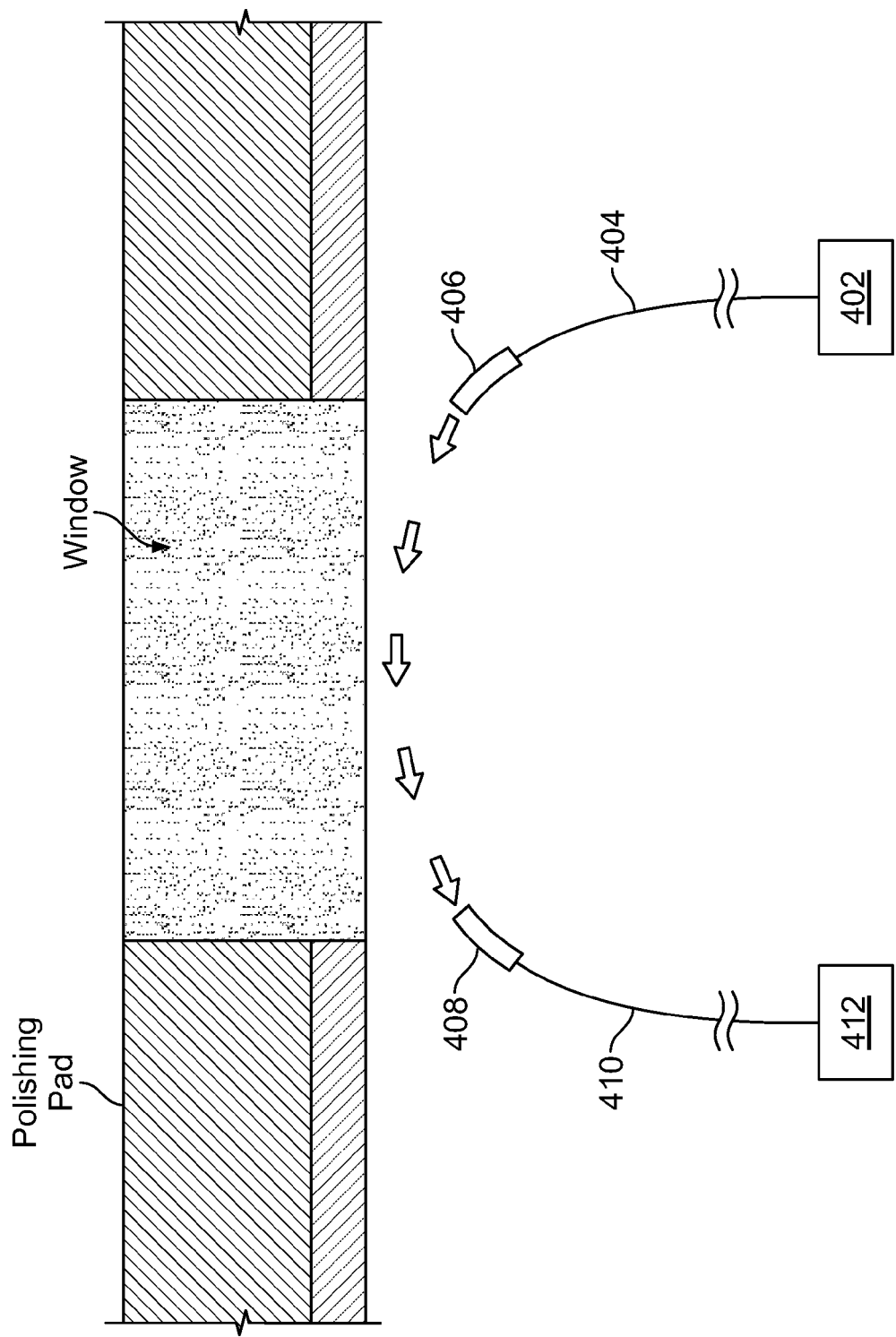
FIG. 4 shows an alternative implementation of the flushing system.

FIG. 4 shows an implementation of the flushing system for preventing the formation of condensation on a bottom surface of the solid window. The system reduces or prevents the formation of condensation at the bottom surface of the polishing pad window. The system includes a gas source 402, a delivery line 404, a delivery nozzle 406, a suction nozzle 408, a vacuum line 410, and a vacuum source 412. The gas source 402 and vacuum source can be configured so that they can introduce and suction a same or a similar volume of gas. The delivery nozzle 406 is situated so that the flow of gas is directed at the bottom surface window in the polishing pad 30.

In one implementation that is an alternative to the implementation of FIG. 4, the flushing system does not include a vacuum source or line. In lieu of these components, the flushing system includes a vent formed in the plated so that the gas introduced into the space underneath the solid window can be exhausted to a side of the platen or, alternatively, to any other location in the polishing apparatus that can tolerate moisture.

The above-described gas source and vacuum source can be located away from the platen so that they do not rotate with the platen. In this case, a rotational coupler for conveying gas is included for each of the supply line and the vacuum line.

Returning to FIG. 1, the polishing apparatus 20 includes a combined slurry/rinse arm 39. During polishing, the arm 39 is operable to dispense slurry 38 containing a liquid and a pH adjuster. Alternative, the polishing apparatus includes a slurry port operable to dispense slurry onto polishing pad 30.

The polishing apparatus 20 includes a carrier head 70 operable to hold the substrate 10 against the polishing pad 30. The carrier head 70 is suspended from a support structure 72, for example, a carousel, and is connected by a carrier drive shaft 74 to a carrier head rotation motor 76 so that the carrier head can rotate about an axis 71. In addition, the carrier head 70 can oscillate laterally in a radial slot formed in the support structure 72. In operation, the platen is rotated about its central axis 25, and the carrier head is rotated about its central axis 71 and translated laterally across the top surface of the polishing pad.

The polishing apparatus also includes an optical monitoring system, which can be used to determine a polishing endpoint as discussed below. The optical monitoring system includes a light source 51 and a light detector 52. Light passes from the light source 51, through the optical access 36 in the polishing pad 30, impinges and is reflected from the substrate 10 back through the optical access 36, and travels to the light detector 52.

A bifurcated optical cable 54 can be used to transmit the light from the light source 51 to the optical access 36 and back from the optical access 36 to the light detector 52. The bifurcated optical cable 54 can include a "trunk" 55 and two "branches" 56 and 58.

As mentioned above, the platen 24 includes the recess 26, in which the optical head 53 is situated. The optical head 53 holds one end of the trunk 55 of the bifurcated fiber cable 54, which is configured to convey light to and from a substrate surface being polished. The optical head 53 can include one or more lenses or a window overlying the end of the bifurcated fiber cable 54 (e.g., as shown in FIG. 3). Alternatively, the optical head 53 can merely hold the end of the trunk 55 adjacent the solid window in the polishing pad. The optical head 53 can hold the above-described nozzles of the flushing system. The optical head 53 can be removed from the recess 26 as required, for example, to effect preventive or corrective maintenance.

The platen includes a removable in-situ monitoring module 50. The in-situ monitoring module 50 can include one or more of the following: the light source 51, the light detector 52, and circuitry for sending and receiving signals to and from the light source 51 and light detector 52. For example, the output of the detector 52 can be a digital electronic signal that passes through a rotary coupler, e.g., a slip ring, in the drive shaft 22 to the controller for the optical monitoring system. Similarly, the light source can be turned on or off in response to control commands in digital electronic signals that pass from the controller through the rotary coupler to the module 50.

The in-situ monitoring module can also hold the respective ends of the branch portions 56 and 58 of the bifurcated optical fiber 54. The light source is operable to transmit light, which is conveyed through the branch 56 and out the end of the trunk 55 located in the optical head 53, and which impinges on a substrate being polished. Light reflected from the substrate is received at the end of the trunk 55 located in the optical head 53 and conveyed through the branch 58 to the light detector 52.

In one implementation, the bifurcated fiber cable 54 is a bundle of optical fibers. The bundle includes a first group of optical fibers and a second group of optical fibers. An optical fiber in the first group is connected to convey light from the light source 51 to a substrate surface being polished. An optical fiber in the second group is connected to received light reflecting from the substrate surface being polished and convey the received light to a light detector. The optical fibers can be arranged so that the optical fibers in the second group form an X-like shape that is centered on the longitudinal axis of the bifurcated optical fiber 54 (as viewed in a cross section of the bifurcated fiber cable 54). Alternatively, other arrangements can be implemented. For example, the optical fibers in the second group can form V-like shapes that are mirror images of each other. A suitable bifurcated optical fiber is available from Verity Instruments, Inc. of Carrollton, Tex.

There is usually an optimal distance between the polishing pad window and the end of the trunk 55 of bifurcated fiber cable 54 proximate to the polishing pad window. The distance can be empirically determined and is affected by, for example, the reflectivity of the window, the shape of the light beam emitted from the bifurcated fiber cable, and the distance to the substrate being monitored. In one implementation, the bifurcated fiber cable is situated so that the end proximate to the window is as close as possible to the bottom of the window without actually touching the window. With this implementation, the polishing apparatus 20 can include a mechanism, e.g., as part of the optical head 53, that is operable to adjust the distance between the end of the bifurcated fiber cable 54 and the bottom surface of the polishing pad window. Alternatively, the proximate end of the bifurcated fiber cable is embedded in the window.

The light source 51 is operable to emit white light. In one implementation, the white light emitted includes light having wavelengths of 200-800 nanometers. A suitable light source is a xenon lamp or a xenon-mercury lamp.

The light detector 52 can be a spectrometer. A spectrometer is basically an optical instrument for measuring properties of light, for example, intensity, over a portion of the electromagnetic spectrum. A suitable spectrometer is a grating spectrometer. Typical output for a spectrometer is the intensity of the light as a function of wavelength.

Optionally, the in-situ monitoring module 50 can include other sensor elements. The in-situ monitoring module 50 can include, for example, eddy current sensors, lasers, light emitting diodes, and photodetectors. With implementations in which the in-situ monitoring module 50 includes eddy current sensors, the module 50 is usually situated so that a substrate being polished is within working range of the eddy current sensors.

Figure 5:
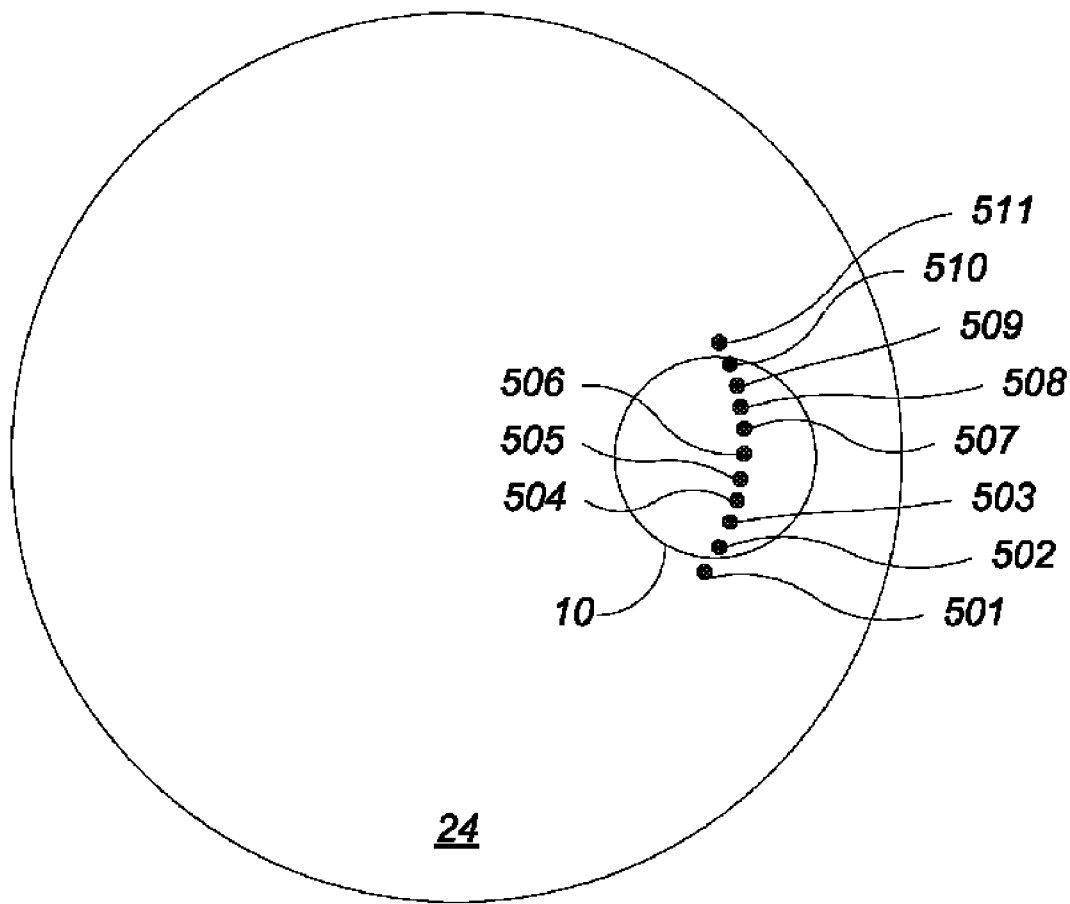
FIG. 5 is an overhead view of a polishing pad and shows locations where in-situ measurements are taken.

The light source 51 and light detector 52 are connected to a computing device operable to control their operation and to receive their signals. The computing device can include a microprocessor situated near the polishing apparatus, e.g., a personal computer. With respect to control, the computing device can, for example, synchronize activation of the light source 51 with the rotation of the platen 24. As shown in FIG. 5, the computer can cause the light source 51 to emit a series of flashes starting just before and ending just after the substrate 10 passes over the in-situ monitoring module. Each of points 501-511 represents a location where light from the in-situ monitoring module impinged upon and reflected off of the substrate 10. Alternatively, the computer can cause the light source 51 to emit light continuously starting just before and ending just after the substrate 10 passes over the in-situ monitoring module.

Figure 6A:
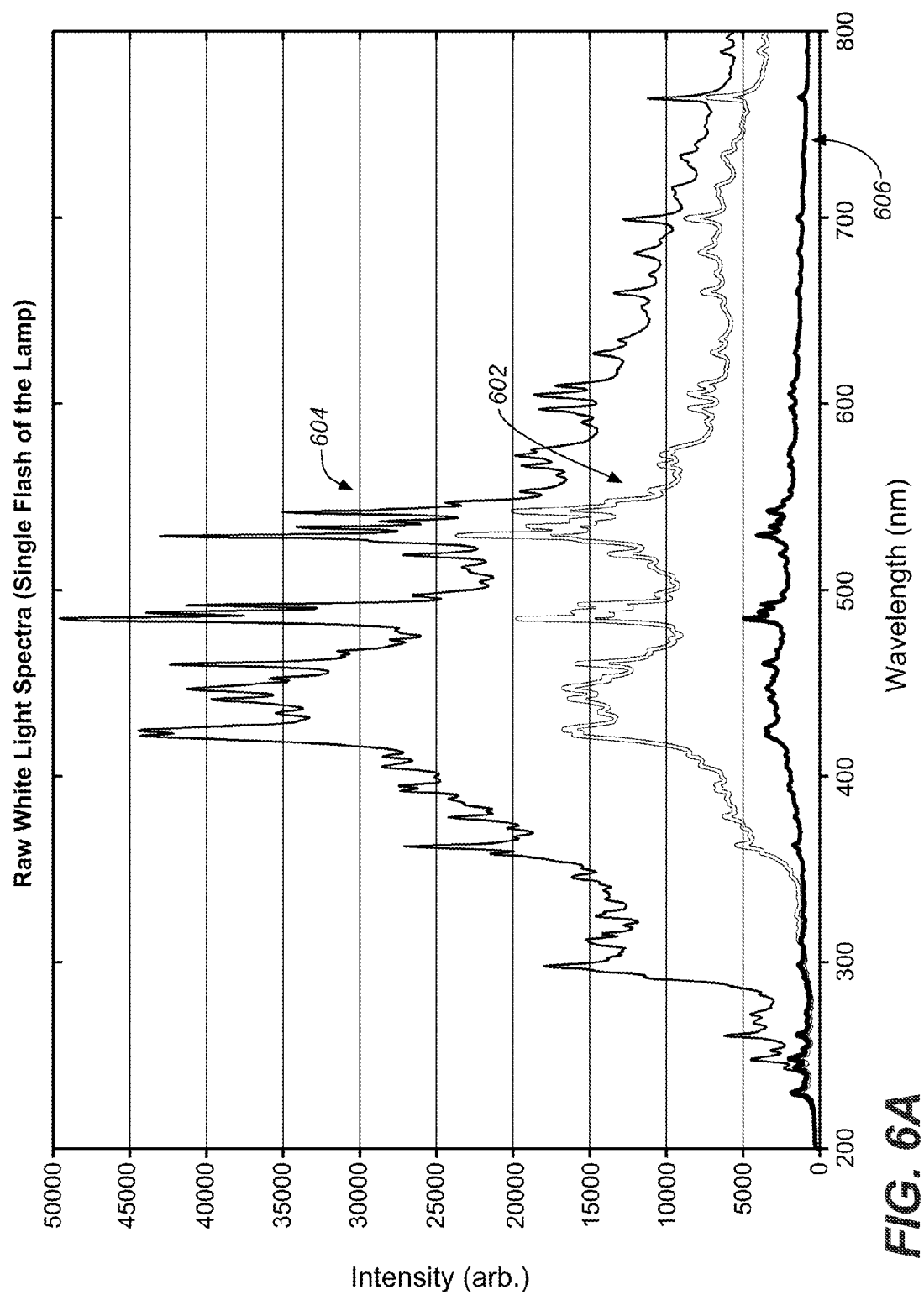
FIG. 6A shows a spectrum obtained from in-situ measurements.

With respect to receiving signals, the computing device can receive, for example, a signal that carries information describing a spectrum of the light received by the light detector 52. FIG. 6A shows examples of a spectrum measured from light that is emitted from a single flash of the light source and that is reflected from the substrate. Spectrum 602 is measured from light reflected from a product substrate. Spectrum 604 is measured from light reflected from a base silicon substrate (which is a wafer that has only a silicon layer). Spectrum 606 is from light received by the optical head 53 when there is no substrate situated over the optical head 53. Under this condition, referred to in the present specification as a dark condition, the received light is typically ambient light.

Figure 6B:
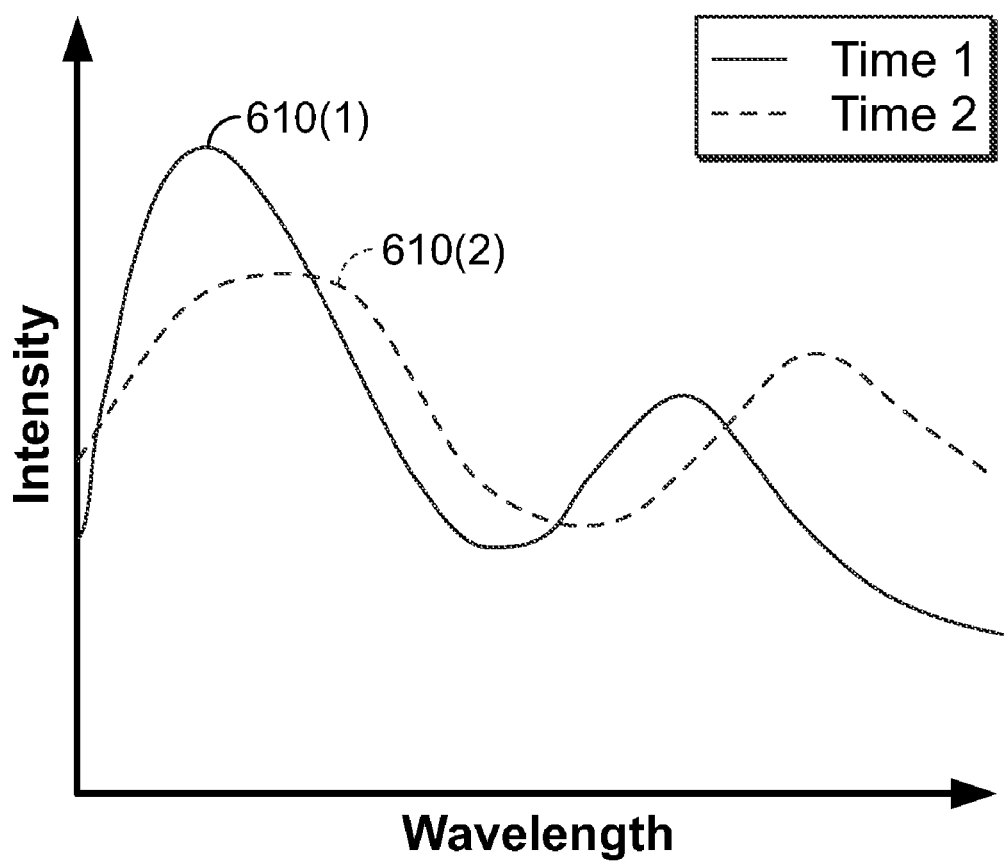
FIG. 6B illustrates the evolution of spectra obtained from in-situ measurements as polishing progresses.

The computing device can process the above-described signal, or a portion thereof, to determine an endpoint of a polishing step. Without being limited to any particular theory, the spectrum of light reflected from the substrate 10 evolves as polishing progresses. FIG. 6B provides an example of the evolution of the spectrum as polishing of a film of interest progresses. The different lines of spectrum represent different times in the polishing. As can be seen, properties of the spectrum of the reflected light change as a thickness of the film changes, and particular spectrums are exhibited by particular thicknesses of the film. When a peak (that is, a local maximum) in the spectrum of reflected light is observed as the polishing of a film progresses, the height of the peak typically changes, and the peak tends to grow wider as material is removed. In addition to widening, the wavelength at which a particular peak is located typically increases as polishing progresses. For example, peak 610(1) illustrates a peak in the spectrum at a certain time during polishing, and peak 610(2) illustrates the same peak at a later time during polishing. Peak 610(2) is located at a longer wavelength and is wider than peak 610(1). The relative change in the wavelength and/or width of a peak (e.g., the width measured at a fixed distance below the peak or measured at a height halfway between the peak and the nearest valley), the absolute wavelength and/or width of the peak, or both can be used to determine the endpoint for polishing according to an empirical formula. The best peak (or peaks) to use when determining the endpoint varies depending on what materials are being polished and the pattern of those materials.

FIG. 7 shows a method 700 for selecting a spectral peak to use when determining the endpoint for the polishing process. Properties of a substrate with the same pattern as the product substrate are measured (step 702). The substrate which is measured is referred to in the instant specification as a "set-up" substrate. The set-up substrate can simply be a substrate which is similar to or the same as the product substrate, or the set-up substrate can be one substrate from a batch of product substrates. The properties that are measured can include a pre-polished thickness of a film of interest at a particular location of interest on the substrate. Typically, the thicknesses at multiple locations are measured. The locations are usually selected so that a same type of die feature is measured for each location. Measurement can be performed at a metrology station.

The set-up substrate is polished in accordance with a polishing step of interest and the spectra obtained during polishing are collected (step 704). Polishing and spectral collection can be performed at the above described-polishing apparatus. The spectra are collected by the in-situ monitoring system during polishing. The substrate is overpolished, i.e., polished past an estimated endpoint, so that the spectrum of the light that is reflected from the substrate when the target thickness is achieved can be obtained.

Properties of the overpolished substrate are measured (step 706). The properties include post-polished thicknesses of the film of interest at the particular location or locations used for the pre-polish measurement.

The measured thicknesses and the collected spectra are used to select, by examining the collected spectra, a particular peak to monitor during polishing (step 708). The peak can be selected by an operator of the polishing apparatus or the selection of the peak can be automated (e.g., based on conventional peak-finding algorithms and an empirical peak-selection formula). If a particular region of the spectrum is expected to contain a peak that is desirable to monitor during polishing (e.g., due to past experience or calculations of peak behavior based on theory), only peaks in that region need be considered. A peak typically is selected that exhibits a significant change in location or width during processing, particularly around the time that a target film thickness is achieved. For example, peaks in a spectrum typically change significantly in location and width when an oxide layer is polished away and an underlying nitride layer is exposed.

Linear interpolation can be performed using the measured pre-polish film thickness and post-polish substrate thickness to determine an approximate time that the target film thickness was achieved. The ways in which the spectral peaks changed leading up to that time can be examined when selecting the peak. The same peak is monitored during the polishing of the rest of the batch of substrates.

Optionally, the spectra are processed to enhance accuracy and/or precision. The spectra can be processed, for example: to normalize them to a common reference, to average them, and/or to filter noise from them. In one implementation, a low-pass filter is applied to the spectra to reduce or eliminate abrupt spikes.

The spectral peak to monitor typically is empirically selected for particular endpoint determination logic so that the target thickness is achieved when the computer device calls an endpoint by applying the particular peak-based endpoint logic. The endpoint determination logic can use the location of the selected peak, the width of the selected peak, the change in location of the selected peak, the change in width of the selected peak, or some combination of these to determine when an endpoint should be called. The change in location or width of the selected peak can be measured relative to an initial location or width of the peak when polishing begins. Alternatively, the change can be measured relative to when the peak reaches a first location or first width after polishing begins. The latter approach may be desirable when initial film thicknesses differ significantly between substrates in the batch. The endpoint determination logic can determine when an endpoint should be called by comparing the monitored value (or values) to a target value of the parameter. If the monitored value matches or is beyond the target value, an endpoint is called. In one implementation the monitored value must match or exceed the target value for some period of time (e.g., two revolutions of the platen) before an endpoint is called.

FIG. 8 shows a method 801 for choosing target values of parameters associated with the selected spectral peak for a particular target thickness and particular endpoint determination logic. A set-up substrate is measured and polished as described above in steps 702-706 (step 803). In particular, spectra are collected and the time at which each collected spectrum is measured is stored.

A polishing rate of the polishing apparatus for the particular set-up substrate is calculated (step 805). The average polishing rate PR can be calculated by using the pre- and post-polished thicknesses T1, T2, and the actual polish time, PT, e.g., PR=(T2−T1)/PT.

An endpoint time is calculated for the particular set-up substrate (step 807) to provide a calibration point to determine target values of the parameters of the selected peak, as discussed below. The endpoint time can be calculated based on the calculated polish rate PR, the pre-polish starting thickness of the film of interest, ST, and the target thickness of the film of interest, TT. The endpoint time can be calculated as a simple linear interpolation, assuming that the polishing rate is constant through the polishing process, e.g., ET=(ST−TT)/PR.

Optionally, the calculated endpoint time can be evaluated by polishing another substrate of the batch of patterned substrates, stopping polishing at the calculated endpoint time, and measuring the thickness of the film of interest. If the thickness is within a satisfactory range of the target thickness, then the calculated endpoint time is satisfactory. Otherwise, the calculated endpoint time can be re-calculated.

Target parameters for the selected peak are recorded from the spectrum collected from the set-up substrate al the calculated endpoint time (step 809). If the parameters of interest involve a change in the selected peak's location or width, that information can be determined by examining the spectra collected during the period of time that preceded the calculated endpoint time.

Figure 9:
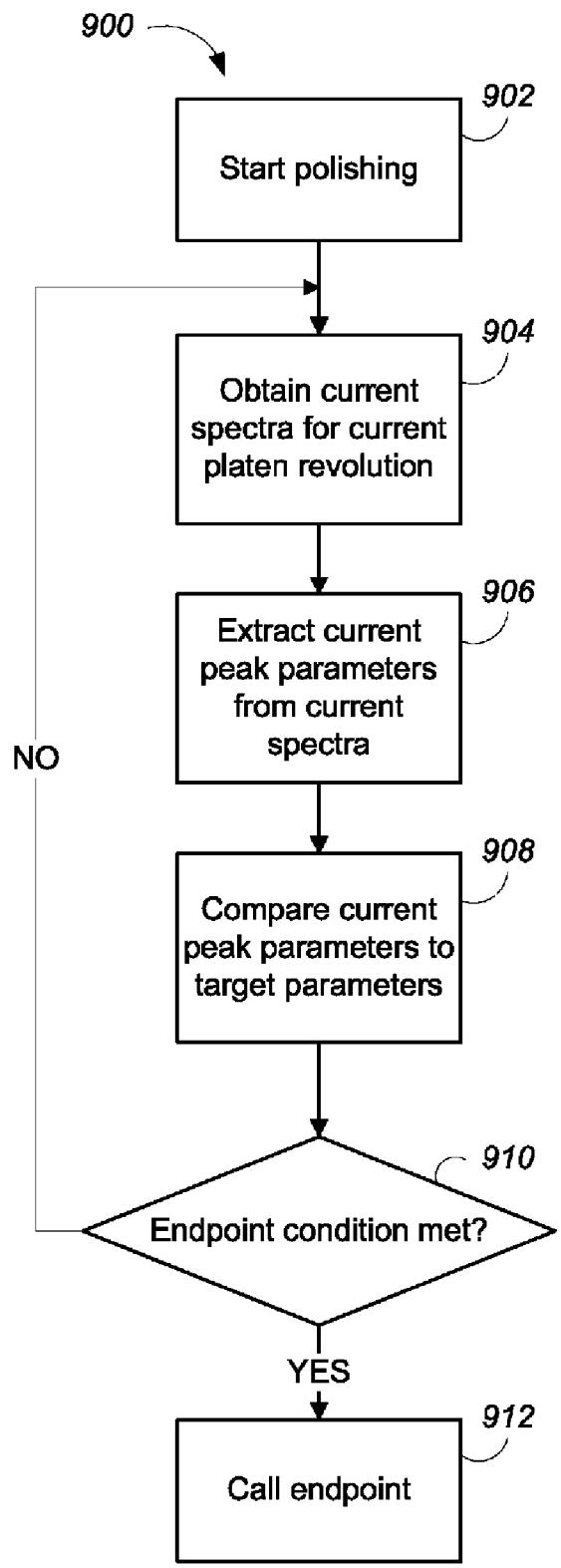
FIG. 9 shows a method for endpoint determination.

FIG. 9 shows a method 900 for using peak-based endpoint determination logic to determine an endpoint of a polishing step. Another substrate of the batch of patterned substrates is polished using the above-described polishing apparatus (step 902). At each revolution of the platen, the following steps are performed.

One or more spectra of light reflecting off a substrate surface being polished are measured to obtain one or more current spectra for a current platen revolution (step 904). The one or more spectra measured for the current platen revolution are optionally processed to enhance accuracy and/or precision as described above in reference to FIG. 7. If only one spectrum is measured, then the one spectrum is used as the current spectrum. If more than one current spectrum is measured for a platen revolution, then they are grouped, averaged within each group, and the averages are designated to be current spectra. The spectra can be grouped by radial distance from the center of the substrate. By way of example, a first current spectrum can be obtained from spectra measured as points 502 and 510 (FIG. 5), a second current spectrum can be obtained from spectra measured at points 503 and 509, a third current spectra can be obtained from spectra measured at points 504 and 508, and so on. The parameters of the selected spectral peak can determined for each current spectrum, and polishing can be monitored separately in each region of the substrate. Alternatively, worst-case values for the parameters of the selected spectral peak can be determined from the current spectra and used by the endpoint determination logic.

Current parameters for the selected peak are extracted from the current spectra (step 906), and the current parameters are compared to the target parameters (step 908) using the endpoint determination logic discussed above in the context of FIG. 7. As long as the endpoint determination logic determines that the endpoint condition has not been met ("no" branch of step 910), polishing is allowed to continue, and steps 904, 906, 908, and 910 are repeated as appropriate. When the endpoint determination logic determines that the endpoint condition has been met ("yes" branch of step 910), an endpoint is called, and polishing is stopped (step 912).

Spectra can be normalized to remove or reduce the influence of undesired light reflections. Light reflections contributed by media other than the film or films of interest include light reflections from the polishing pad window and from the base silicon layer of the substrate. Contributions from the window can be estimated by measuring the spectrum of light received by the in-situ monitoring system under a dark condition (i.e., when no substrates are placed over the in-situ monitoring system). Contributions from the silicon layer can be estimated by measuring the spectrum of light reflecting of a bare silicon substrate. The contributions are usually obtained prior to commencement of the polishing step. A measured raw spectrum is normalized as follows:

normalized spectrum=(A−Dark)/(Si−Dark)

where A is the raw spectrum, Dark is the spectrum obtained under the dark condition, and Si is the spectrum obtained from the bare silicon substrate.

In the described embodiment, a peak in the spectrum is used to perform endpoint detection. Valleys in the spectrum (that is, local minima) also can be used, either instead of the peak or in conjunction with the peak. Multiple peaks (or valleys) also can be used when detecting the endpoint. For example, each peak can be monitored individually, and an endpoint can be called when a majority of the peaks meet an endpoint condition.

In an alternative embodiment, a fixed wavelength in the spectrum is selected, and the number of peaks that move through that fixed wavelength during polishing are counted. A peak moves through the fixed wavelength when during one revolution of the platen the peak was on one side of the fixed wavelength, and during the following revolution the peak was on the opposite side of the fixed wavelength. Once the number of peaks that have moved through the fixed wavelength reaches a per-determined threshold, polishing is halted.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in an information carrier, e.g., in a machine-readable storage device or in a propagated signal, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

The above described polishing apparatus and methods can be applied in a variety of polishing systems. Either the polishing pad, or the carrier head, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims. For example, the actions recited in the claims can be performed in a different order and still achieve desirable results.

What is claimed is:

1. A non-transitory computer program product, tangibly embodied on a computer readable storage device, comprising instructions to cause a polishing system to perform the operations of:

storing a predetermined criterion for detecting an end point using a selected peak in a spectrum of light;

polishing a substrate;

measuring a sequence of current spectra of light reflected from the substrate while the substrate is being polished, wherein the selected peak persists with at least an evolving location or width through the sequence of current spectra;

for each current spectrum in the sequence of current spectra, measuring one or more of a current location and a current width of the selected peak in the current spectrum;

determining whether the current location or the current width, respectively, of the selected peak in a latest current spectrum in the sequence of current spectra satisfies the predetermined criterion; and ceasing to polish the substrate when the current location or the current width, respectively, of the selected peak is determined to satisfy the predetermined criterion.

2. The product of claim 1, further comprising instructions operable to perform the operation of:
for each current spectrum in the sequence of current spectra, enhancing the current spectrum.

3. The product of claim 1, further comprising instructions operable to perform the operations of:
for each current spectrum in the sequence of current spectra,
measuring additional spectra of light reflected from the substrate during polishing; and
combining at least one of the additional spectra with the current spectrum.

4. The product of claim 1, wherein:
the predetermined criterion specifies a target location or target width for the selected peak.

5. The product of claim 1, further comprising instructions operable to perform the operations of:
polishing a set-up substrate;
measuring calibration spectra of light reflected from the set-up substrate while the set-up substrate is being polished;
estimating an endpoint time at which a film on the set-up substrate has reached a desired thickness; and
determining the predetermined criterion from the calibration spectra collected before and at the estimated endpoint time.

6. The computer program product of claim 1, wherein for each current spectrum in the sequence of current spectra, a current location of the selected peak in the current spectrum is measured.

7. The computer program product of claim 1, wherein for each current spectrum in the sequence of current spectra, a current width of the selected peak in the current spectrum is measured.

8. The product of claim 1, wherein:
the predetermined criterion specifies a target amount of change in the current location or the current width, respectively, of the selected peak.

9. The product of claim 8, wherein:
the target amount of change is measured relative to a predetermined initial location or a predetermined initial width, respectively, for the selected peak.

10. A method comprising:
storing a predetermined criterion for detecting an end point using a selected peak in a spectrum of light;
polishing a substrate;
measuring a sequence of current spectra of light reflected from the substrate while the substrate is being polished, wherein the selected peak persists with at least an evolving location or width through the sequence of current spectra;
for each current spectrum in the sequence of current spectra, measuring one or more of a current location and a current width of the selected peak in the current spectrum;
determining whether the current location or the current width, respectively, of the selected peak in a latest current spectrum in the sequence of current spectra satisfies the predetermined criterion; and
ceasing to polish the substrate when the current location or the current width, respectively, of the selected peak is determined to satisfy the predetermined criterion.

11. The method of claim 10, further comprising:
for each current spectrum in the sequence of current spectra, enhancing the current spectrum.

12. The method of claim 10, further comprising:
for each current spectrum in the sequence of current spectra,
measuring additional spectra of light reflected from the substrate during polishing; and
combining at least one of the additional spectra with the current spectrum.

13. The method of claim 10, wherein:
the predetermined criterion specifies a target location or target width for the selected peak.

14. The method of claim 10, further comprising:
polishing a set-up substrate;
measuring calibration spectra of light reflected from the set up substrate while the set up substrate is being polished;
estimating an endpoint time at which a film on the set up substrate has reached a desired thickness; and
determining the predetermined criterion from the calibration spectra collected before and at the estimated endpoint time.

15. The method of claim 10, wherein for each current spectrum in the sequence of current spectra, a current location of the selected peak in the current spectrum is measured.

16. The method of claim 10, wherein for each current spectrum in the sequence of current spectra, a current width of the selected peak in the current spectrum is measured.

17. The method of claim 10, wherein:
the predetermined criterion specifies a target amount of change in the current location or the current width, respectively, of the selected peak.

18. The method of claim 17, wherein:
the target amount of change is measured relative to a predetermined initial location or a predetermined initial width, respectively, for the selected peak.

* * * * *